United States Patent
Koizumi et al.

(10) Patent No.: US 7,605,080 B2
(45) Date of Patent: Oct. 20, 2009

(54) SEMICONDUCTOR DEVICE AND METHOD OF MANUFACTURING THE SAME

(75) Inventors: Naoyuki Koizumi, Nagano (JP); Masahiro Sunohara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 304 days.

(21) Appl. No.: 11/509,700

(22) Filed: Aug. 25, 2006

(65) Prior Publication Data
US 2007/0048973 A1   Mar. 1, 2007

(30) Foreign Application Priority Data
Aug. 29, 2005   (JP)   ............... P2005-248399

(51) Int. Cl.
*H01L 21/44* (2006.01)

(52) U.S. Cl. ............... 438/667; 257/774; 257/E21.597; 257/E23.067

(58) Field of Classification Search ................ 438/638, 438/667, 669, 671, 675, 678, 706, 717, 672; 257/774, E21.597, E23.067
See application file for complete search history.

(56) References Cited

U.S. PATENT DOCUMENTS

| | | | |
|---|---|---|---|
| 6,620,731 B1 | 9/2003 | Farnworth et al. | 438/667 |
| 6,852,621 B2 * | 2/2005 | Hanaoka et al. | 438/638 |
| 6,873,054 B2 * | 3/2005 | Miyazawa et al. | 257/774 |
| 2004/0212086 A1 | 10/2004 | Dotta et al. | 257/737 |

FOREIGN PATENT DOCUMENTS

| | | |
|---|---|---|
| EP | 1 439 576 A2 | 7/2004 |
| JP | 2002-373895 | 12/2002 |
| JP | 2002-373957 | 12/2002 |

* cited by examiner

*Primary Examiner*—Quoc D Hoang
(74) *Attorney, Agent, or Firm*—Drinker Biddle & Reath LLP

(57) ABSTRACT

In a method of manufacturing a semiconductor device having a through electrode 56 that connects an electrode pad 20 of a semiconductor element 14, which has a device forming layer 18 and the electrode pad 20 on one surface side, and a rewiring pattern 52 on other surface side of the semiconductor element 14, the device forming layer 18 and the electrode pad 20 are formed on an upper surface side of the semiconductor element 14, a first resist layer 62 is formed on surfaces of the electrode pad 20 and the device forming layer 18, an opening 64 is formed in the electrode pad 20 by the etching, and a through hole 54 is formed in the semiconductor element 14 by the etching in a position that is communicated with the opening 64. The device forming layer 18 is protected by the first resist layer 62, and also a flip-chip connection can be applied by providing the through electrode 56 to attain a downsizing.

5 Claims, 12 Drawing Sheets

SEMICONDUCTOR DEVICE AND METHOD OF MANUFACTURING THE SAME

TECHNICAL FIELD

The present disclosure relates to a semiconductor device constructed to form electrodes connected to electrode pads of a semiconductor element that has a device forming layer and the electrode pads on its one surface side, and a method of manufacturing the same.

RELATED ART

For example, as the semiconductor device having such a structure that the electrodes of the semiconductor element as typified by the optoelectronic element such as the light receiving element, the light emitting element, or the like, in which the device forming layer is formed on the substrate, are connected to the wiring patterns formed on the substrate, there is the semiconductor device constructed as shown in FIG. 7. In this semiconductor device 10, a semiconductor element 14 is adhered onto a wiring substrate 12 by an adhesive 16 and a device forming layer 18 and Al electrode pads 20 are formed on an upper surface of the semiconductor element 14. A plurality of Al electrode pads 20 provided around the device forming layer 18 are connected to wiring patterns 24 on the wiring substrate 12 via Au wires 22 stretched by the wire bonding. Also, a passivating layer (protection film) 26 is laminated on a surface of the device forming layer 18 (device surface).

In the semiconductor device 10 constructed in this manner, a space required to pull out the Au wires 22 must be provided around the semiconductor element 14 and thus a size of the overall device is increased. Therefore, it is difficult to attain a miniaturization of the device.

Also, the method of flip-flop connecting a plurality of Al electrode pads 20 to the wiring patterns 24 via the solder bumps may be considered. In this case, a light is blocked by the wiring substrate 12 because the device forming layer 18 opposes to the wiring substrate 12. Therefore, this method cannot be employed in the optoelectronic element whose device forming layer 18 receives a light or emits a light.

As the method to solve such problem, such an approach is considered that the above wiring bonding is eliminated by providing the through electrodes in the substrate to attain a size reduction of the device. As the method of manufacturing the through electrode, there is the method of forming the through holes by irradiating a laser beam into the substrate, and then forming the wiring pattern on inner peripheral surfaces of the through holes (see Patent Literature 1 (Japanese Patent Unexamined Publication No. 2002-373895) and Patent Literature 2 (Japanese Patent Unexamined Publication No. 2002-373957), for example)

However, in the manufacturing methods set forth in Patent Literatures 1, 2, an inner peripheral shape of the through hole is formed as a taper shape (an opening on the upper surface side has a large diameter and an opening on the lower surface side has a small diameter). Therefore, the through holes that are opened largely must be formed on the upper surface side of the semiconductor element 14, on which the device forming layer 18 is formed, and the through holes must be formed in positions that are away correspondingly from the device forming layer 18. As a result, such a problem exists that it is hindered that a miniaturization of the semiconductor device should be achieved.

Also, when it is requested that a fine through hole having a high aspect ratio should be formed, the method of employing the dry etching is considered. In this case, such a problem arises that the device forming layer of the semiconductor element is damaged depending on the plasma atmosphere in the dry etching.

SUMMARY

Embodiments of the present invention provide a semiconductor device capable of achieving a size reduction of the device and forming through holes and through electrodes in a state that a device forming layer is protected, and a method of manufacturing the same.

According to a first aspect of one or more embodiments of the invention, there is provided with a method of manufacturing a semiconductor device having a through electrode that connects an electrode pad of a semiconductor element, which has a device forming layer and the electrode pad on one surface side, and the other surface side of the semiconductor element, which includes a first step of forming a first resist layer on surfaces of the electrode pad and the device forming layer on one surface side of the semiconductor element; a second step of forming an opening in the electrode pad by an etching; a third step of forming a through hole, one end of which is communicated with the opening and other end of which is opened on an other surface side of the semiconductor element, in the semiconductor element by the etching; and a fourth step of forming the through electrode in the through hole.

In a second aspect of one or more embodiments of the invention, the second step contains a step of forming a second resist layer on an inner periphery of the opening in the electrode pad.

A third aspect of one or more embodiments of the invention provides the method of manufacturing the semiconductor device, which further includes a fifth step of pasting a protection film on a surface of the first resist layer or the second resist layer.

A fourth aspect of one or more embodiments of the invention provides the method of manufacturing the semiconductor device, which further includes a sixth step of forming an insulating layer from other surface side of the semiconductor element to spread the insulating layer on an inner peripheral of the through hole, which extends to one surface side of the semiconductor element, and a lower surface of the protection film.

A fifth aspect of one or more embodiments of the invention provides the method of manufacturing the semiconductor device, which further includes a seventh step of exposing one side of the through hole by releasing the protection film.

A sixth aspect of one or more embodiments of the invention provides the method of manufacturing the semiconductor device, which further includes an eighth step of forming a power feeding layer on other surface side of the semiconductor element and forming the through electrode in the through hole by plating.

A seventh aspect of one or more embodiments of the invention provides a semiconductor device comprising: an electrode pad formed on one surface side of a semiconductor element, on which a device forming layer is formed, via an insulating layer; a through hole formed by an etching to pass through the electrode pad and the semiconductor element in a state that a resist is coated on one surface side of the semiconductor element; an insulating layer formed on an inner periphery of the through hole to project from the through hole to one surface side of the semiconductor element; a through electrode formed in the insulating layer, the through electrode connecting the electrode pad and the other surface side of the semiconductor element; and a conductive layer for connecting the electrode pad formed on an outer side of the insulating layer and an end portion of the through hole.

In an eighth aspect of one or more embodiments of the invention, the device forming layer is an optically functioning element to receive a light or emit the light.

In a ninth aspect of one or more embodiments of the invention, the device forming layer is an image sensor to sense a light and output an image signal.

Various implementations may include one or more the following advantages. For example, the first resist layer is formed on the surfaces of the electrode pads and the devide forming layer on one surface side of the semiconductor element on which the device forming layer and the electrode pads are formed. Accordingly, the device forming layer is protected by the first resist layer when the opening is formed in the electrode pad by the etching, so that the through holes can be formed in such a condition that the device forming layer is not damaged by the plasma. Therefore, a miniaturization can be accomplished by forming the fine through holes in vicinity of the device forming layer, and also the through holes can be formed from the side on which the device forming layer is mounted. As a result, an alignment needed when the through holes are processed can be executed easily.

Also, the second resist layer is formed on the inner periphery of the opening of the electrode pad. Therefore, the inner peripheral surface of the electrode pad can be protected when the through hole communicated with the opening in the electrode pad is formed by the dry etching.

Also, the protection film is pasted on the surface of the first resist layer or the second resist layer to close the through holes from one side of the substrate. Therefore, the insulating layer can be formed on the overall inner surfaces of the through holes from the other side of the substrate, and also one side of the through hole can be opened by a simple operation, i.e., by peeling off the protection film.

Also, in case device forming layer is composed of the optically functioning element containing the image sensor, the through electrodes can be formed in a state that the device forming layer composed of the optically functioning element is formed on the upper surface side of the substrate, the through electrodes can be fitted into the wiring substrate by the flip-chip connection via the rewiring on the lower surface side of the semiconductor element, and the through electrodes can be constructed not to disturb a light reception or a light emission of the device forming layer composed of the optically functioning element.

DETAILED DESCRIPTION

A best mode for carrying out the present invention will be explained with reference to the drawings hereinafter.

Embodiment 1

Figure 1:
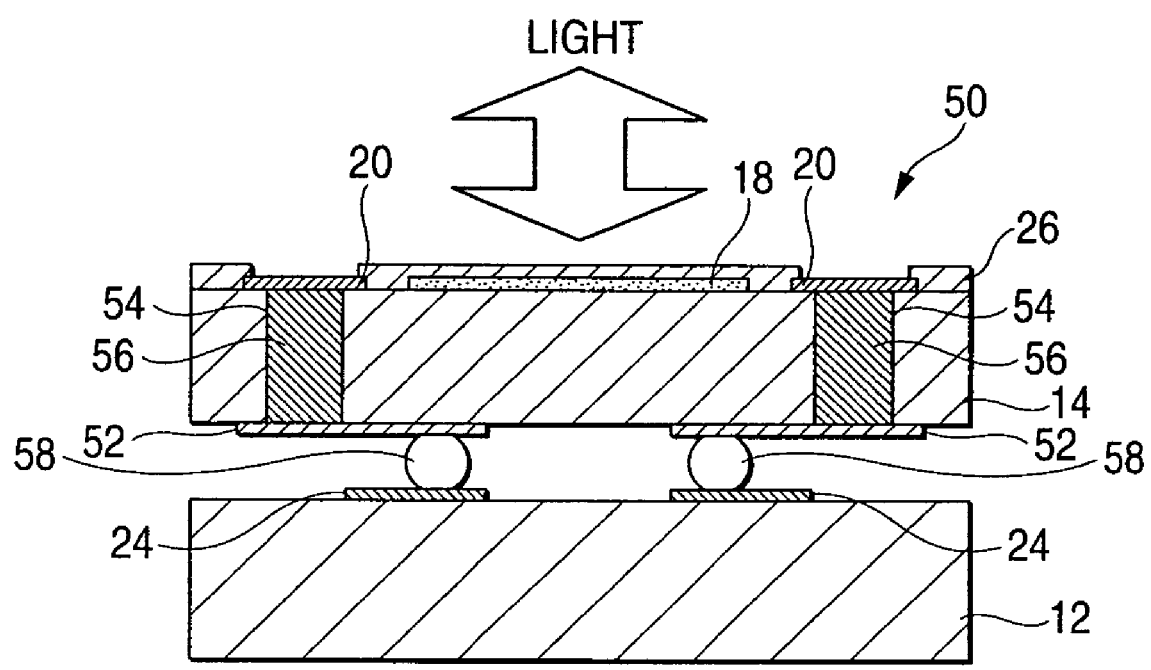
FIG. 1 is a longitudinal sectional view showing an embodiment of a semiconductor device according to the present invention.
Figure 7:
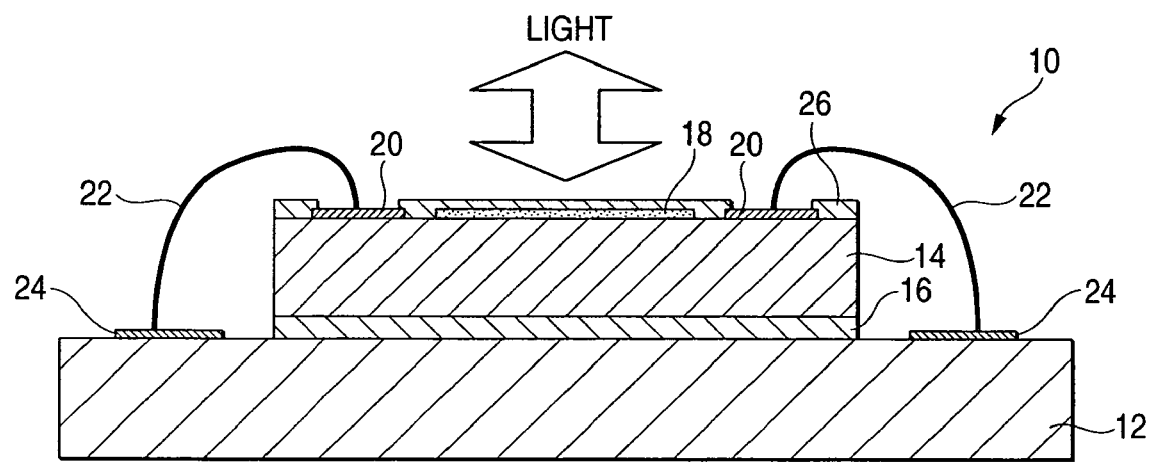
FIG. 7 is a view showing an example of a semiconductor device in the related art.

FIG. 1 is a longitudinal sectional view showing an embodiment of a semiconductor device according to the present invention. In FIG. 1, the same reference symbols are affixed to the same portions as those shown in FIG. 7. As shown in FIG. 1, a semiconductor device 50 is constructed by forming through electrodes, each connects the Al electrode pad 20 and a rewiring pattern 52, in the semiconductor element 14 (including the device forming layer 18 formed of the optically functioning element, the Al electrode pads 20, the passivating layer 26, and an insulating layer 60). Also, the light receiving element for receiving a light, the light emitting element for emitting a light, the image sensor for sensing a light to output an image signal, or the like, for example, is cited as the device forming layer 18.

A plurality of Al electrode pads 20 connected electrically to the device forming layer 18 are provided around the device forming layer 18, and the rewiring patterns 52 are provided on a lower surface of the semiconductor element 14. Through holes 54 passing through the semiconductor element 14 are provided between the Al electrode pads 20 and the rewiring patterns 52 by the dry etching. Through electrodes 56 are formed in insides of the through holes 54 by the Cu plating.

In addition, the rewiring patterns 52 provided on the lower surface of the semiconductor element 14 are connected to the wiring patterns 24 on the wiring substrate 12 via solder bumps 58.

In this manner, the semiconductor device 50 is constructed to connect the Al electrode pads 20 and the rewiring patterns 52 via the through electrodes 56 and flip-chip connect the rewiring patterns 52 of the semiconductor element 14 and the wiring patterns 24 on the wiring substrate 12 via the solder bumps 58. Therefore, a considerable size reduction can be accomplished rather than the configuration using the wire bonding (see FIG. 7) in the related art. In addition, since the device forming layer 18 is arranged on the upper surface of the semiconductor element 14, the semiconductor device 50 is constructed not to disturb the light reception or the light emission of the device forming layer 18.

As the method of manufacturing the semiconductor device 50, for example, there are the manufacturing methods (a) to (c) described in the following. (a) In the first manufacturing method, a plurality of device forming layers 18, the Al electrode pads 20, the passivating layer 26, and an insulating layer 60 constituting respective semiconductor elements 14 are formed on the Si wafer on which a plurality of semiconductor elements 14 are formed. Then, the through electrodes 56 are formed, and then the rewiring step and the solder bump forming step are applied. Finally, respective semiconductor devices 50 are cut off by the dicing step.

(b) In the second manufacturing method, a plurality of device forming layers 18, the Al electrode pads 20, the passivating layer 26, and the insulating layer 60 constituting respective semiconductor elements 14 are formed on the Si wafer on which a plurality of semiconductor elements 14 are formed. Then, respective semiconductor elements 14 are cut off by the dicing step, and then the through electrodes 56 are formed every semiconductor element 14. Finally, the rewiring step and the solder bump forming step are applied.

(c) In the third manufacturing method, respective Si small pieces constituting the semiconductor elements 14 are cut off from the Si wafer by the dicing. Then, the semiconductor element 14 is obtained by forming the device forming layer 18, the Al electrode pads 20, the passivating layer 26, and the insulating layer 60 on this Si small piece, and then the through electrodes 56 are formed every semiconductor element 14. Finally, the rewiring step and the solder bump forming step are applied.

In the present embodiment, explanation will be made hereunder by taking as an example the case where the manufacturing method in (a) is employed. According to this manufacturing method, the through electrodes 56 can be formed collectively in the silicon substrate having a large number of semiconductor elements 14, and therefore a mass productivity can be enhanced much more.

Here, steps of manufacturing the through electrodes 56 of the semiconductor device 50 will be explained in detail hereunder. The steps of manufacturing the through electrodes 56 are roughly classified into (1) step of forming the opening, (2) step of forming the insulating layer, (3) step of forming the through electrode (4) step of ensuring an electrical continuity between the electrode pad and the through electrode, and (5) step of rewiring and removing the resist. In following FIG. 2A to FIG. 6C, for convenience of explanation, the Al electrode pads 20, which are connected to the device forming layer 18 and the through electrodes 56, and their neighboring areas are depicted in an enlarged fashion, and the device forming layer 18 is omitted from the illustration.

(1) Step of Forming the Opening

FIG. 2A to FIG. 2F are views explaining steps (#1 to #6) of forming an opening in a method of manufacturing a semiconductor device according to the present invention. In steps shown in FIG. 2A, a flat plate silicon material (silicon substrate) used to form the semiconductor elements 14 is prepared. Then, the insulating layer ($SiO_2$) 60 is formed on the upper surface (front surface) of the silicon substrate (for convenience, illustrated as the semiconductor elements 14 in FIG. 2 to FIG. 6), and then the device forming layer 18 is formed on the upper surface of the insulating layer 60.

The Al electrode pad 20 is formed around the device forming layer 18 by the thin film forming method such as the vapor deposition, or the like. Also, the passivating layer 26 such as SiN, polyimide, or the like is stacked on the surface of the insulating layer 60 and the upper surface of the Al electrode pad 20 except its center portion.

Figure 2A:
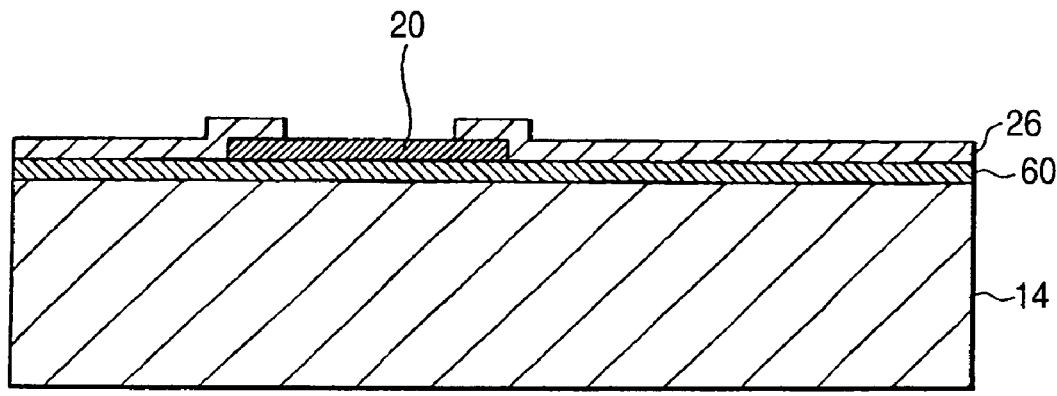
FIG. 2A is a view explaining steps (#1) of forming an opening in a method of manufacturing a semiconductor device according to the present invention.
Figure 2B:
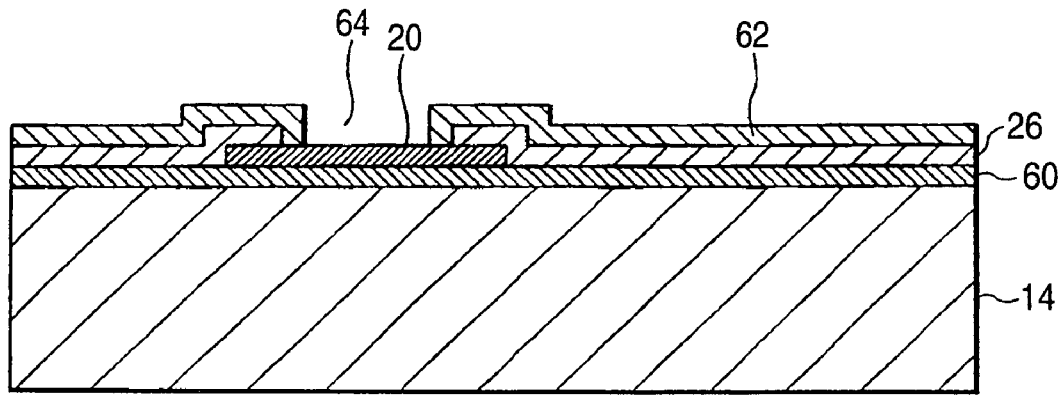
FIG. 2B is a view explaining steps (#2) of forming an opening in a method of manufacturing a semiconductor device according to the present invention.

In steps shown in FIG. 2B, a first resist layer 62 is formed by coating the photoresist on a surface of the passivating layer 26. In case the photoresist is the positive resist, the photoresist coated on a center portion of upper surface of the Al electrode pad 20 is fused by irradiating a light onto the center portions of the upper surfaces of the Al electrode pad 20. Thus, an opening 64 is formed to oppose to the center portions of the upper surface of the Al electrode pad 20.

Also, in case the photoresist is the negative resist, the photoresist coated on the center portion of the upper surfaces of the Al electrode pad 20 is fused by irradiating a light onto peripheral portions except the center portion of the upper surface of the Al electrode pad 20. Thus, the opening 64 is formed. Also, in this step, since the opening 64 is formed in the first resist layer 62 by irradiating a light from the top side of the semiconductor element 14, an alignment on the lower surface (back surface) of the semiconductor element 14 is not needed.

Figure 2C:
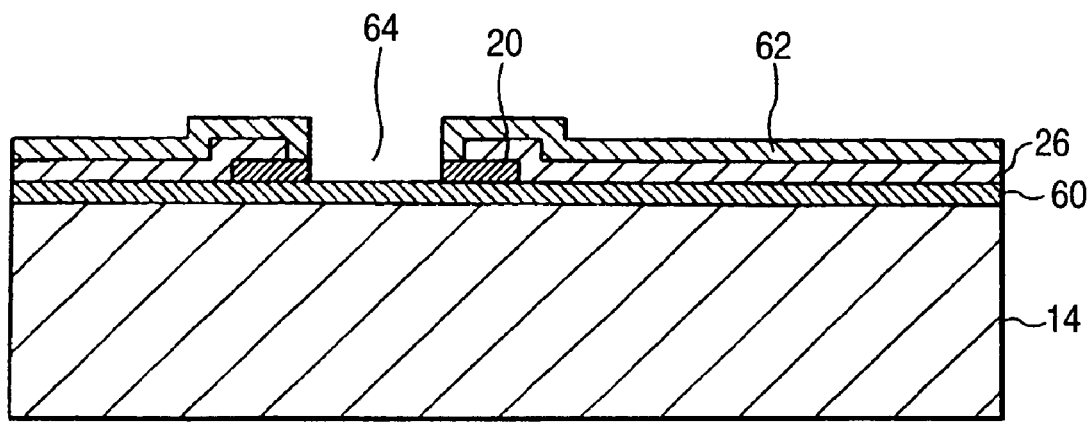
FIG. 2C is a view explaining steps (#3) of forming the opening in the method of manufacturing the semiconductor device according to the present invention.

In steps shown in FIG. 2C, the opening 64 is provided in the center portion of the Al electrode pad 20 by the dry etching. In the dry etching such as the reactive ion etching, positive ions in the plasma are shot into the center portions of the upper surfaces of the Al electrode pads 20, which are not covered with the first resist layer 62, and thus the center portion of the Al electrode pad 20 is removed from the top in the vertical direction. Accordingly, the Al electrode pad 20 has a hollow shape having the opening 64 in its center portion. Also, since the device forming layer 18 is covered with the first resist layer 62 during the dry etching of the opening 64, there is no possibility that the device forming layer 18 is damaged.

Figure 2D:
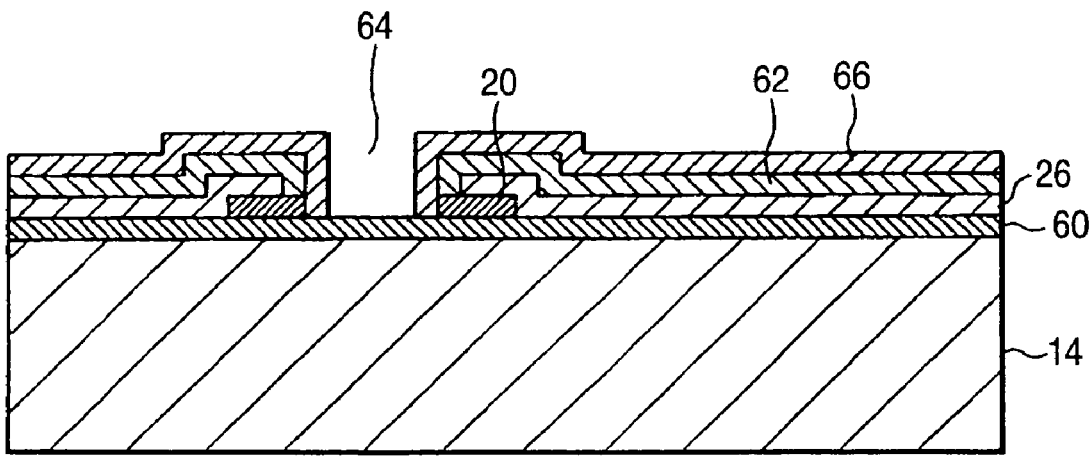
FIG. 2D is a view explaining steps (#4) of forming the opening in the method of manufacturing the semiconductor device according to the present invention.

In steps shown in FIG. 2D, a second resist layer 66 is formed by coating the photoresist on the surface of the first resist layer 62 and an inner peripheral surface of the opening 64 and patterning the photoresist. The second resist layer 66 aims at protecting the inner peripheral surface of the opening 64. Therefore, a thickness of the second resist layer 66 may be set thinner than that of the first resist layer 62. Also, if the inner peripheral surface of the opening 64 is not damaged by the plasma when the through hole 54 is formed in the semiconductor element 14 by the dry etching, the second resist layer 66 can be omitted.

Figure 2E:
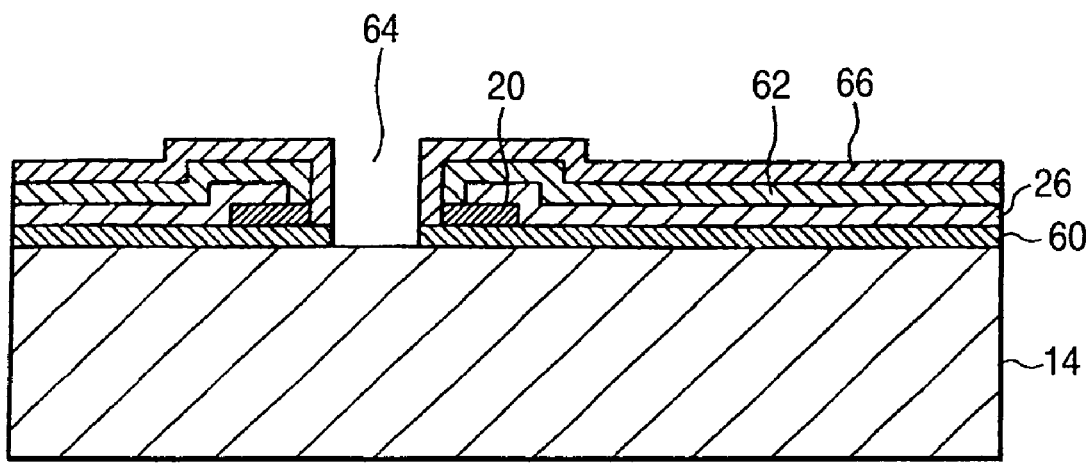
FIG. 2E is a view explaining steps (#5) of forming the opening in the method of manufacturing the semiconductor device according to the present invention.

In steps shown in FIG. 2E, a portion of the insulating layer 60 formed on the lower side of the Al electrode pads 20, which opposes to the opening 64, is removed from the top side by the dry etching. At that time, the inner peripheral surface of the Al electrode pad 20 is protected from the plasma by the second resist layer 66, and also the device forming layer 18 is protected by the first resist layer 62.

Figure 2F:
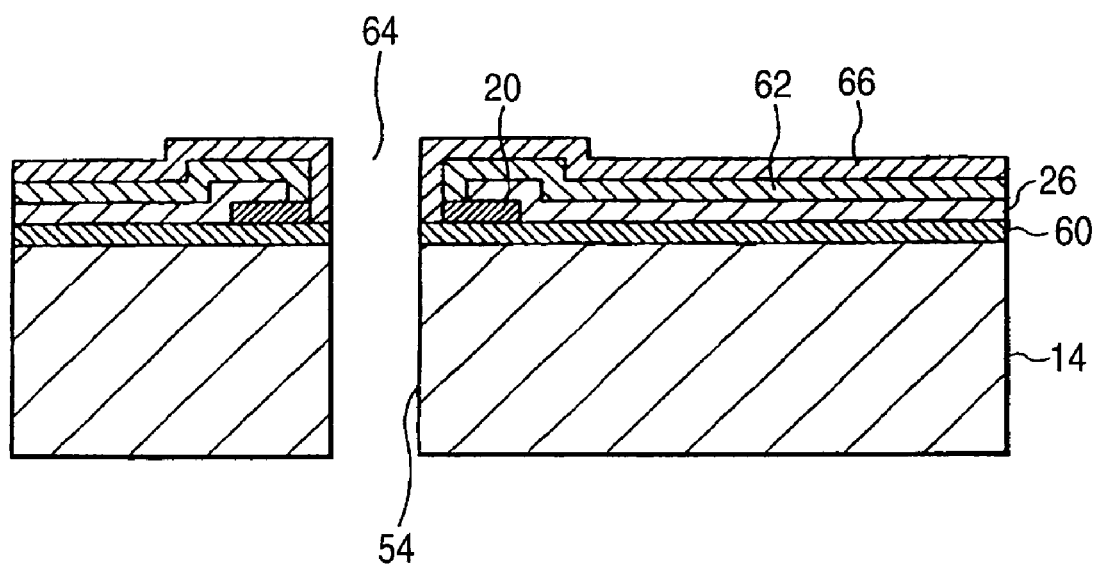
FIG. 2F is a view explaining steps (#6) of forming the opening in the method of manufacturing the semiconductor device according to the present invention.

In steps shown in FIG. 2F, a portion of the semiconductor element 14, which is communicated with the opening 64, is removed from the top side by the dry etching, and thus the through hole 54 is passed through up to the bottom surface side of the semiconductor element 14. At that time, the inner peripheral surface of the Al electrode pad 20 is protected from the plasma by the second resist layer 66, and also the device forming layer 18 is protected by the first resist layer 62.

In this way, the through hole 54 can be provided by the dry etching from the top side of the semiconductor element 14 on which the device forming layer 18 is formed. Therefore, the fine through hole 54 having a high aspect ratio can be formed and also it can be prevented by the first resist layer 62 and the second resist layer 66 that the device forming layer 18 and the inner peripheral surface of the Al electrode pad 20 are damaged by the plasma. In addition, since the opening 64 and the through hole 54 can be processed from the upper surface side, an alignment to be applied from the back surface side can be omitted and also the opening forming steps can be easily executed.

(2) Step of Forming the Insulating Layer

Figure 3A:
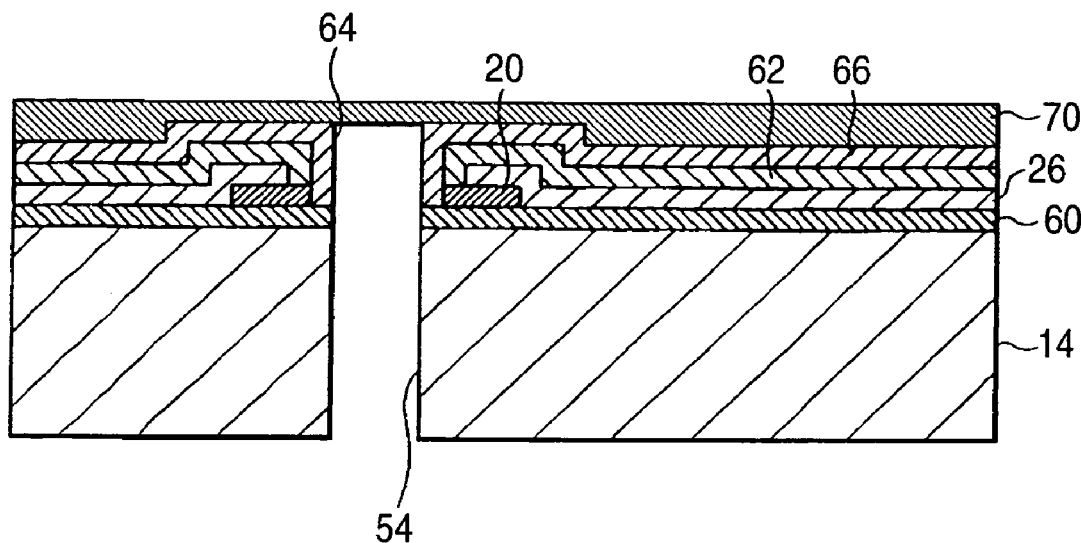
FIG. 3A is a view explaining steps (#1) of forming an insulating layer in a method of manufacturing a semiconductor device according to the present invention.
Figure 3B:
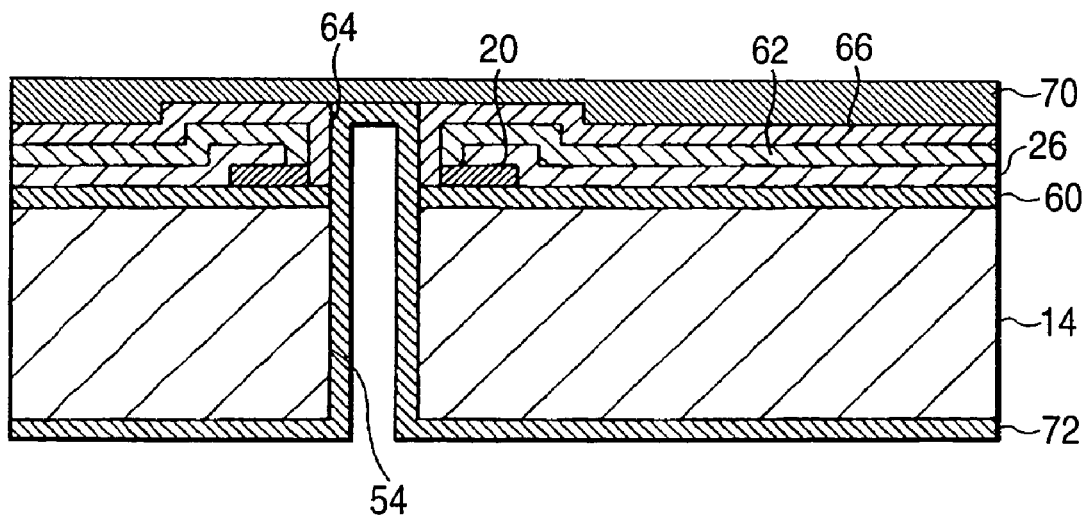
FIG. 3B is a view explaining steps (#2) of forming the insulating layer in the method of manufacturing the semiconductor device according to the present invention.
Figure 3C:
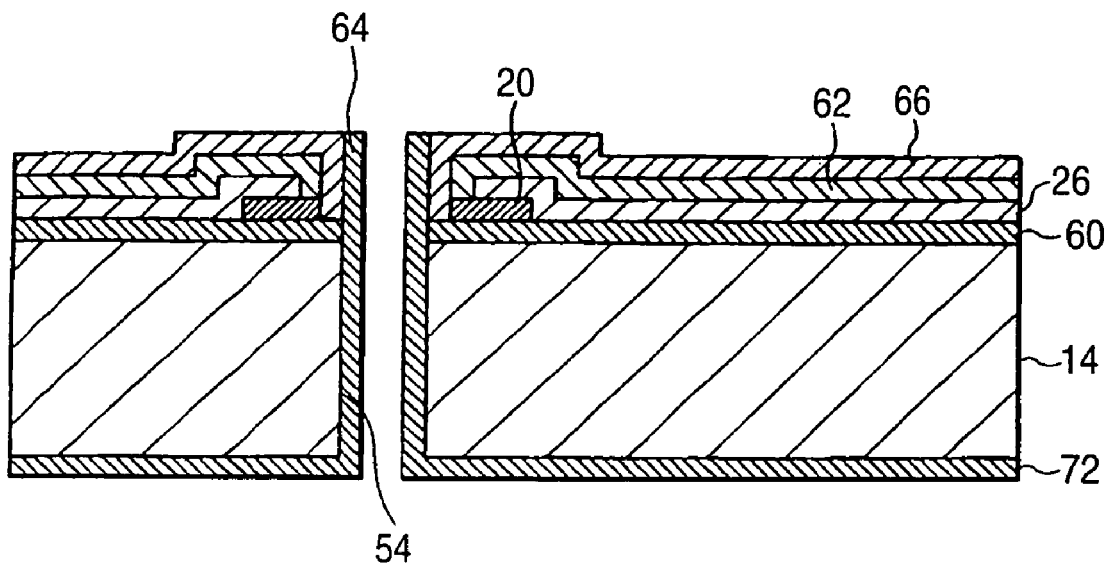
FIG. 3C is a view explaining steps (#3) of forming the insulating layer in the method of manufacturing the semiconductor device according to the present invention.

FIG. 3A to FIG. 3C are views explaining steps (#1 to #3) of forming an insulating layer in a method of manufacturing a semiconductor device according to the present invention. In steps shown in FIG. 3A, a protection film 70 made of a resin is pasted on an upper surface of the second resist layer 66. This protection film 70 protects the device forming layer 18 and also closes the opening 64 communicated with the through hole 54 from the upper surface side.

In steps shown in FIG. 3B, an insulating layer 72 made of $SiO_2$, SiN, organic insulating film such as polymide or the like is formed from the lower surface side of the semiconductor element 14 by the thin film forming method such as the plasma CVD (Chemical Vapor Deposition), PVD (Physical Vapor Deposition) or the like. Also, the insulating layer 72 is coated and formed on the lower surface side of the semiconductor element 14, the inner peripheral surface of the through hole 54, and the inner peripheral surface of the opening 64. Also, since the upper surface side of the opening 64 is blocked by the protection film 70, the insulating layer 72 is also formed on a lower surface of the protection film 70 that contacts the openings 64.

In steps shown in FIG. 3C, the protection film 70 is released. Since this protection film 70 can be released while a portion of the insulating layer 72 to close the opening 64 is being stuck to its lower surface, the cylindrical insulating layer 72 for covering the inner peripheral surfaces of the through hole 54 and the opening 64 is formed to pass through from the upper surface side to the lower surface side. Since all steps applied from the dry etching of the through hole 54 and the opening 64 to the formation of the insulating layer 72 are the dry step, the inner peripheral surfaces of the through hole 54 and the opening 64 are maintained in a clean condition. Therefore, the step of cleaning the through hole 54 and the opening 64 can be omitted.

(3) Step of Forming the Through Electrode

Figure 4A:
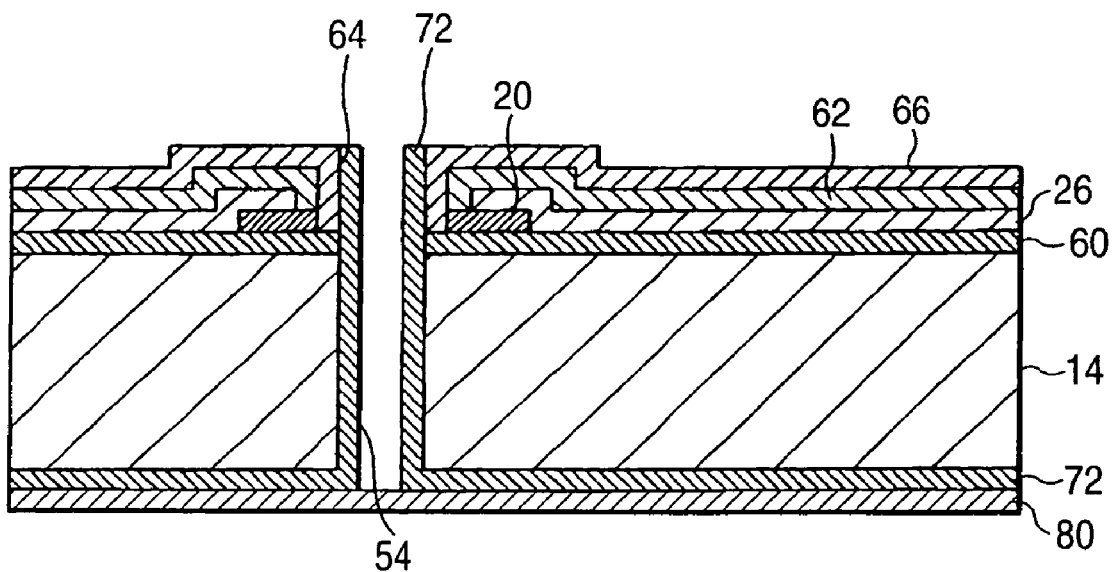
FIG. 4A is a view explaining steps (#1) of forming a through electrode in a method of manufacturing a semiconductor device according to the present invention.
Figure 4B:
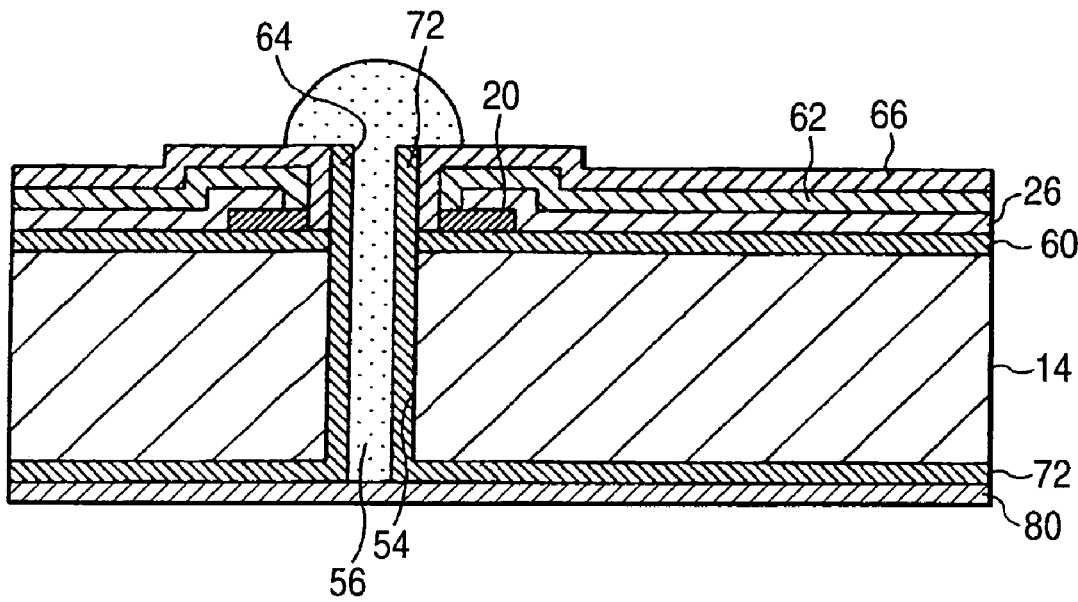
FIG. 4B is a view explaining steps (#2) of forming the through electrode in the method of manufacturing the semiconductor device according to the present invention.
Figure 4C:
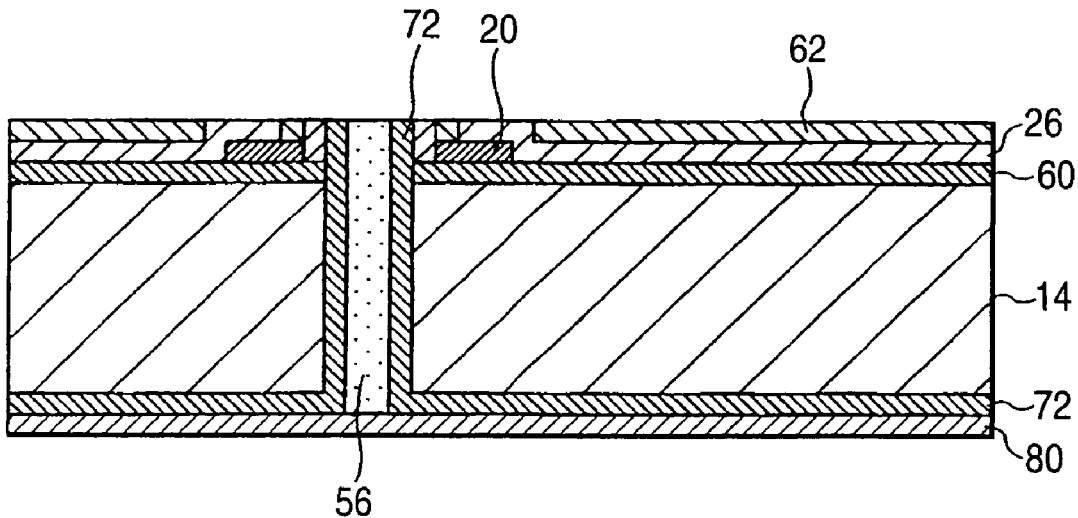
FIG. 4C is a view explaining steps (#3) of forming the through electrode in the method of manufacturing the semiconductor device according to the present invention.

FIG. 4A to FIG. 4C are views explaining steps (#1 to #3) of forming a through electrode in a method of manufacturing a semiconductor device according to the present invention. In steps shown in FIG. 4A, a power feeding layer 80 is formed by pasting a conductive material on a lower surface of the insulating layer 72. Therefore, the lower surface side of the through hole 54 is closed by the power feeding layer 80.

In steps shown in FIG. 4B, the through electrode 56 is formed in the through hole 54 by the plating. For example, a metal (Cu, Au, or the like) is deposited and grown on a surface of the power feeding layer 80 opposing to the through hole 54 by the electroplating. Thus, the through electrode 56 is formed in the through hole 54 and the opening 64. In this case, an upper end portion of the through electrode 56 is projected upward from the opening 64.

In steps shown in FIG. 4C, the upper surface side of a resultant structure is polished and planarized by the CMP (chemical Mechanical Polishing). Thus, the second resist layer 66 and the top end portion of the through electrode 56 are removed by the polishing. Therefore, the device forming layer 18 is still protected by the first resist layer 62 after the upper surface side is planarized by the CMP.

In this manner, the through electrode 56 can be filled in the inside of the cylindrical insulating layer 72, which covers the inner peripheral surfaces of the through hole 54 and the opening 64, while using the power feeding layer 80 as the base. At this time, the second resist layer 66 may be left if the top end portion of the through electrode 56 can be planarized.

(4) Step of Ensuring an Electrical Continuity Between the Electrode Pad and the Through Electrode FIG. 5A to FIG. 5D are views explaining steps (#1 to #4) of ensuring an electrical continuity between an electrode pad and a through electrode in a method of manufacturing a semiconductor device according to the present invention. In steps shown in FIG. 5A, a third resist layer 82 is formed by coating the photoresist on the planarized upper surface. Then, an opening 84 is formed by removing a portion of the third resist layer 82, which covers an area located over the Al electrode pad 20. The third resist layer 82 is coated thicker than the first resist layer 62 and the second resist layer 66.

Figure 5A:
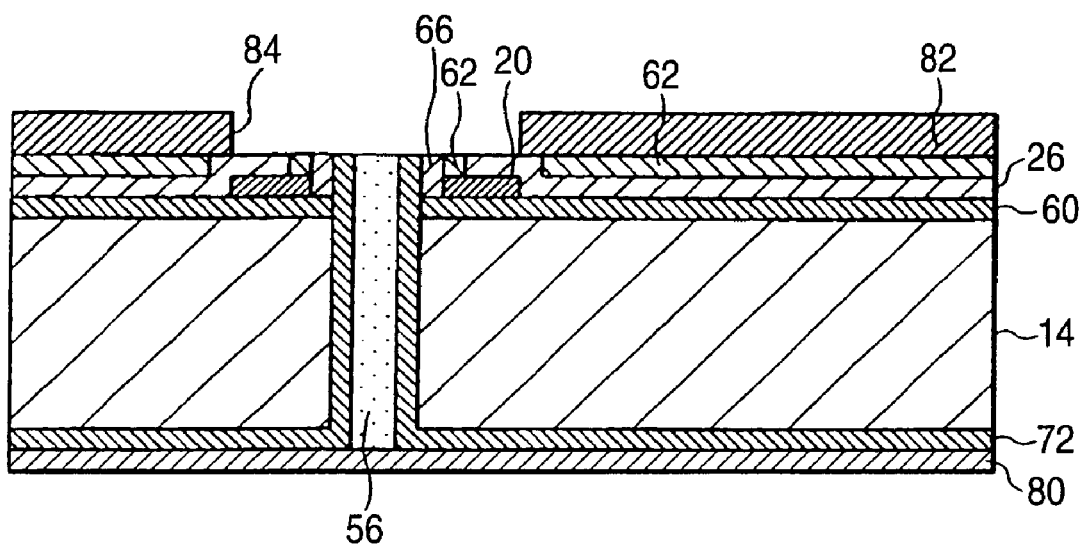
FIG. 5A is a view explaining steps (#1) of ensuring an electrical continuity between an electrode pad and a through electrode in a method of manufacturing a semiconductor device according to the present invention.
Figure 5B:
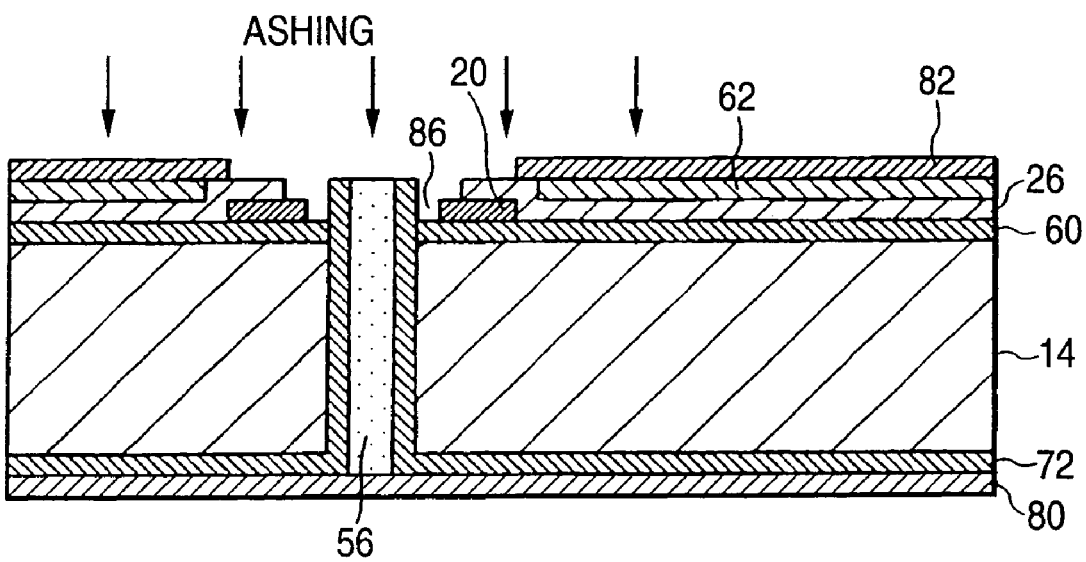
FIG. 5B is a view explaining steps (#2) of ensuring the electrical continuity between the electrode pad and the through electrode in the method of manufacturing the semiconductor device according to the present invention.

In steps shown in FIG. 5B, the first resist layer 62 and the second resist layer 66 left around the top end portion of the through electrode 56 are removed by applying the ashing from the upper surface side. Accordingly, the inner periphery of the Al electrode pad 20 and the top end portion of the through electrode 56 covered with the insulating layer 72 are exposed, so that a recess portion 86 from which the top portion of the through electrode 56 is projected in a position that is lower than the third resist layer 82 is exposed.

In this case, a surface layer portion of the third resist layer 82 is removed by the ashing. However, since the third resist layer 82 is coated thick, the device forming layer 18 is protected by the third resist layer 82 even when the first resist layer 62 and the second resist layer 66 left around the top end portion of the through electrode 56 are removed by the ashing.

Figure 5C:
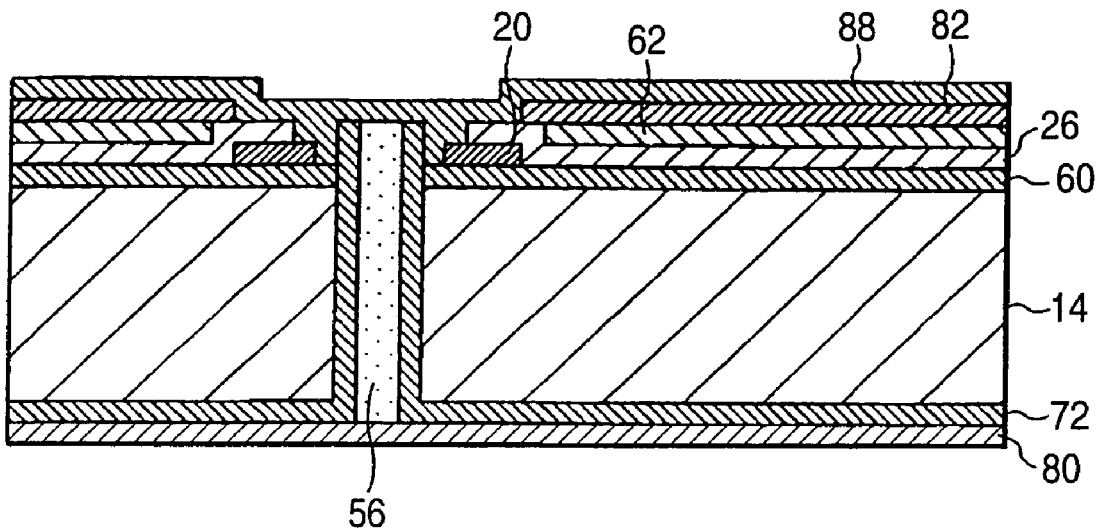
FIG. 5C is a view explaining steps (#3) of ensuring the electrical continuity between the electrode pad and the through electrode in the method of manufacturing the semiconductor device according to the present invention.

In steps shown in FIG. 5C, a metal layer (conductive member) 88 is formed from the top side by the thin film forming method such as the sputter, or the like. The metal layer 88 is a thin film made of a conductive material such as copper, or the like, and is deposited on the inside of the recess portion 86 that is formed like an annular recess by the ashing in a position that is lower than the third resist layer 82. Therefore, the inner periphery of the Al electrode pad 20 and the top portion of the through electrode 56 are connected conductively via the metal layer 88.

Figure 5D:
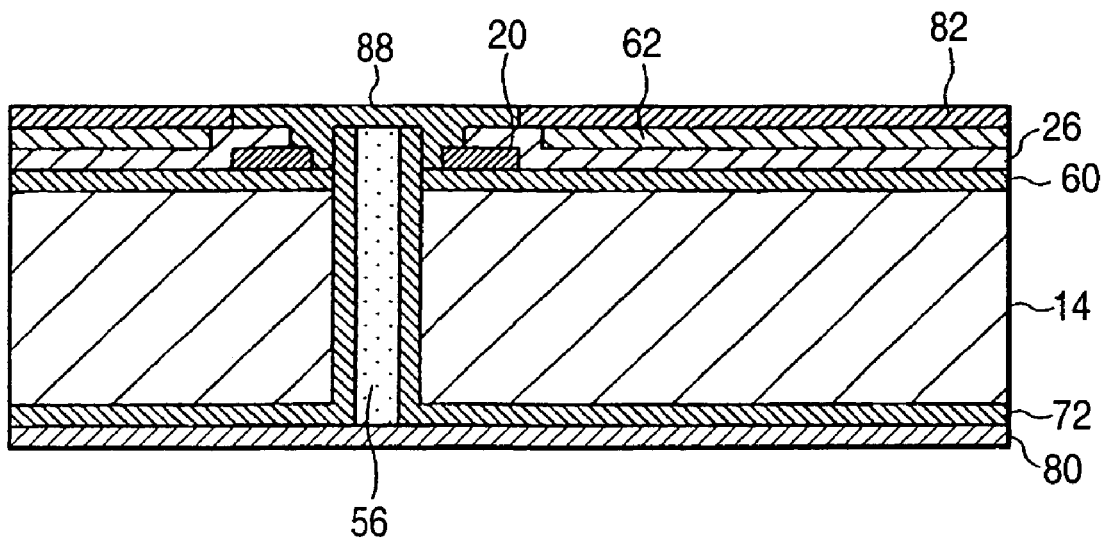
FIG. 5D is a view explaining steps (#4) of ensuring the electrical continuity between the electrode pad and the through electrode in the method of manufacturing the semiconductor device according to the present invention.

In steps shown in FIG. 5D, the metal layer 88 stacked on the third resist layer 82 is removed by the etching, the CMP, or the like except the portion that connects conductively the Al electrode pad 20 and the through electrode 56, and thus an upper surface is planarized. The device forming layer 18 is still protected by the first resist layer 62 even after the upper surface is planarized by removing the unnecessary portion of the metal layer 88 in this step.

Therefore, the metal layer 88 functions as a conductive layer that connects the Al electrode pad 20 formed on the outside of the insulating layer 72 and the end portion of the through electrode 56 formed in the inside of the insulating layer 72. Also, the metal layer 88 is provided in an unreleasable condition because its adhering area is increased by a level difference between the outer periphery of the cylindrical insulating layer 72 projected to the upper surface side and the Al electrode pad 20 and a level difference between the passivating layer 26 and the Al electrode pad 20.

(5) Step of Rewiring and Removing the Resist

Figure 6A:
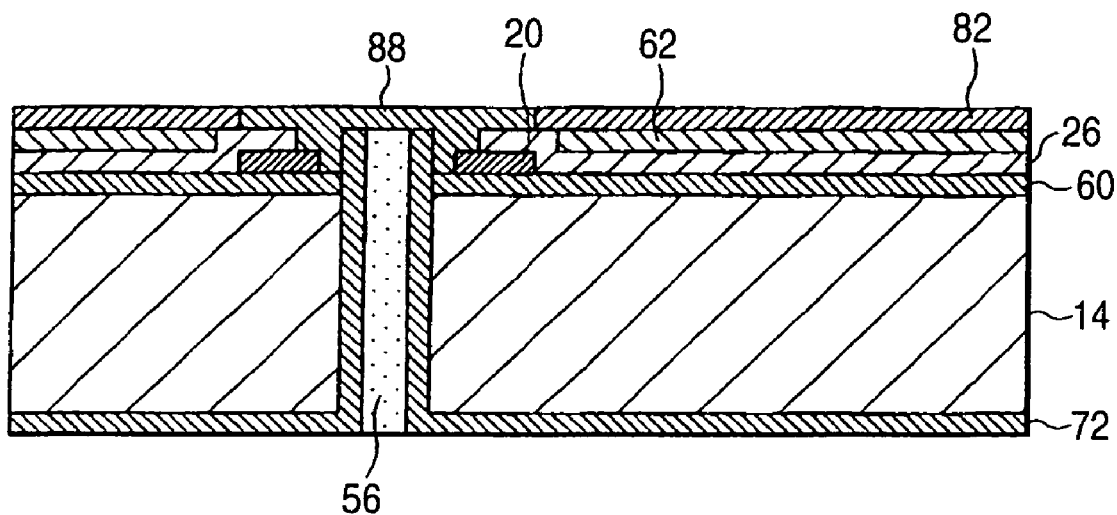
FIG. 6A is a view explaining steps (#1) of rewiring and removing a resist in a method of manufacturing a semiconductor device according to the present invention.
Figure 6B:
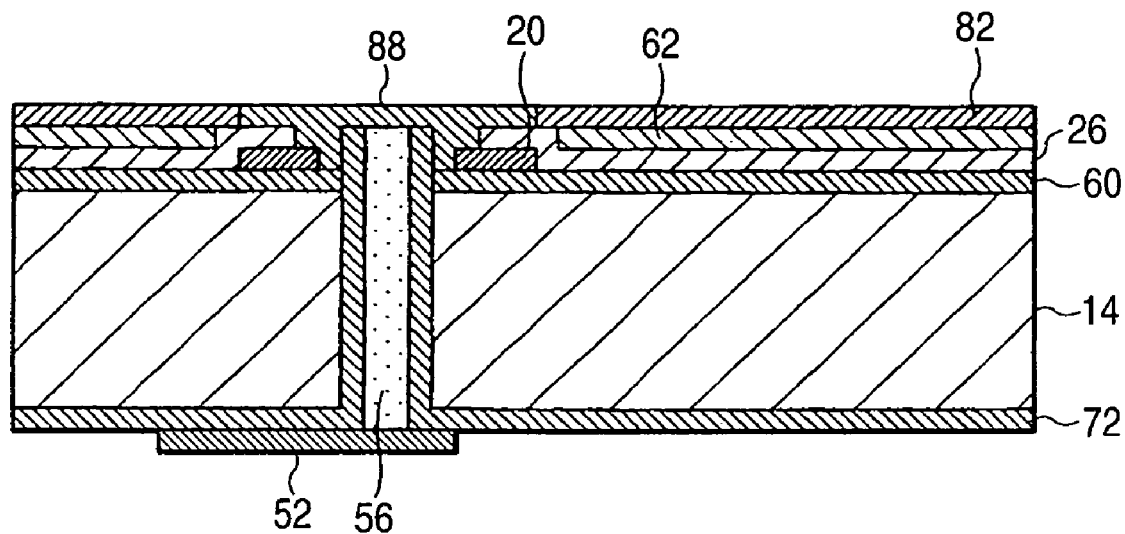
FIG. 6B is a view explaining steps (#2) of rewiring and removing the resist in the method of manufacturing the semiconductor device according to the present invention.
Figure 6C:
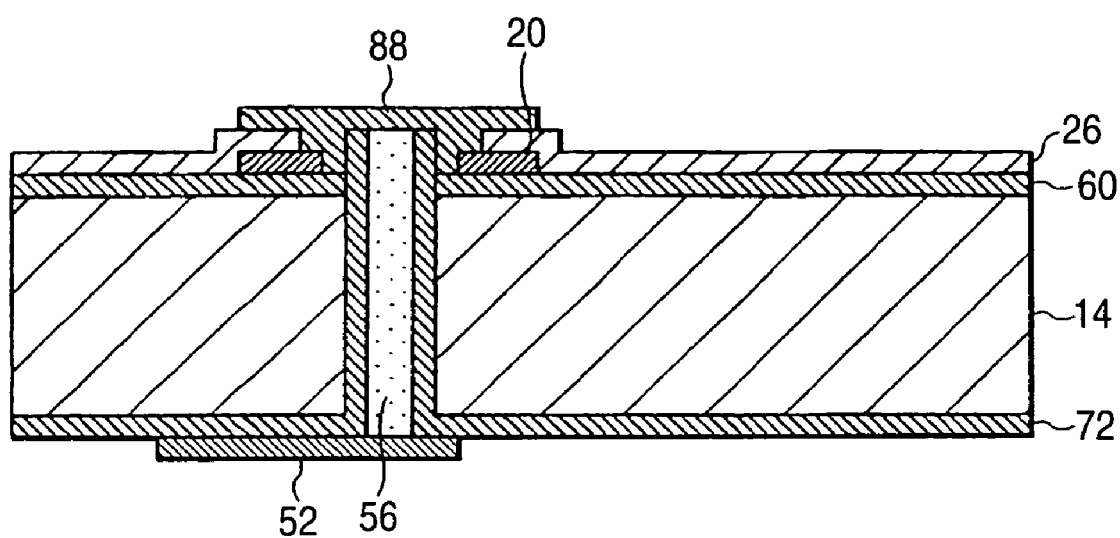
FIG. 6C is a view explaining steps (#3) of rewiring and removing the resist in the method of manufacturing the semiconductor device according to the present invention.

FIG. 6A to FIG. 6C are views explaining steps (#1 to #3) of rewiring and removing a resist in a method of manufacturing a semiconductor device according to the present invention. In steps shown in FIG. 6A, the insulating layer 72 is exposed by removing the power feeding layer 80 formed on the lower surface side (back surface side) of the semiconductor element 14 by means of the etching.

In steps shown in FIG. 6B, the rewiring pattern 52 is formed by forming a metal layer such as Cu, or the like on the lower surface side (back surface side) of the semiconductor element 14 by the sputter method and etching the metal layer. Also, the rewiring pattern may be formed on the upper surface side (front surface side) of the semiconductor element 14, as the case may be.

In steps shown in FIG. 6C, the first resist layer 62 and the third resist layer 82 left on the upper surface side (front surface side) of the semiconductor element 14 are removed. In this manner, the first resist layer 62 for protecting the device forming layer 18 is formed at first and removed in the last step. Therefore, the damage of the device forming layer 18 can be prevented until respective steps of (1) step of forming the opening, (2) step of forming the insulating layer, (3) step of forming the through electrode, (4) step of ensuring an electrical continuity between the electrode pad and the through electrode, and (5) step of rewiring and removing the resist are finished.

Then, the semiconductor device 50 of a predetermined dimension is cut out from the silicon substrate, to which the device forming layer 18, the Al electrode pads 20, the passivating layer 26, the through electrodes 56, and the rewiring patterns 52 are provided, by the dicing step. Also, in steps shown in FIG. 6C, the semiconductor device 50 of a predetermined dimension may be cut out from the silicon substrate by the dicing step after the solder bumps 58 are provided to the rewiring patterns 52.

In the embodiment, the device forming layer 18 formed on the semiconductor element 14 is not limited to the optically functioning element. It is of course that other devices may be employed.

In the embodiment, the configuration in which the device forming layer 18, the Al electrode pads 20, the passivating film 26, the through electrodes 56, and the rewiring patterns 52 are formed on the silicon substrate is cited as an example, but the present invention is not limited to this configuration. It is of course that the semiconductor substrate made of gallium arsenide, or the like may be employed in place of the silicon substrate.

In the embodiment, in case the rewiring patterns 52 are formed on the lower surface (back surface) side of the silicon substrate is explained, but the present invention is not limited to this case. The formation of the rewiring patterns 52 may be omitted, and the solder bumps 58 may be bonded directly to the lower ends of the through electrodes 56.

In the embodiment, the etching applied to the Al electrode pads and the semiconductor element to form the through hole 54 and the opening 64 is a dry etching; however, the through hole 54 and the opening 64 may be formed by a wet etching.

Further, in the embodiment, the power feeding layer 80 is formed on the lower surface of the insulating layer 72; however, the power feeding layer 80 may be formed on the upper surface of the second resist layer 66 and the upper surface of the opening 64 may be closed by the power feeding layer 80. In this case, an upper end portion of the through electrode 56 is projected downward from the lower surface side of the through hole 54 and the top end portion of the through electrode 56 are removed by the polishing.

What is claimed is:

1. A method of manufacturing a semiconductor device having a through electrode that connects an electrode pad of a semiconductor element, which has a device forming layer and the electrode pad on one surface side, and the other surface side of the semiconductor element, comprising:

a first step of forming a first resist layer on surfaces of the electrode pad and the device forming layer on said one surface side of the semiconductor element;

a second step of forming an opening in the electrode pad by an etching performed from the one surface side, the second step including a step of forming a second resist layer on an inner periphery of the opening in the electrode pad;

a third step of forming a cylindrical through hole, one end of which is communicated with the opening and other end of which is opened on the other surface side of the semiconductor element, in the semiconductor element by an etching performed from the one surface side; and a fourth step of forming the through electrode in the through hole; and a fifth step of pasting a protection film on a surface of the second resist layer.

2. A method of manufacturing a semiconductor device, according to claim 1, further comprising:

an eighth step of forming a power feeding layer on the other surface side of the semiconductor element and forming the through electrode in the through hole by plating.

3. A method of manufacturing a semiconductor device, according to claim 1, wherein the etching performed in the second and third steps is a dry etching.

4. A method of manufacturing a semiconductor device having a through electrode that connects an electrode pad of a semiconductor element, which has a device forming layer and the electrode pad on one surface side, and the other surface side of the semiconductor element, comprising:

a first step of forming a first resist layer on surfaces of the electrode pad and the device forming layer on said one surface side of the semiconductor element;

a second step of forming an opening in the electrode pad by an etching and forming a second resist layer on an inner periphery of the opening in the electrode pad;

a third step of forming a through hole, one end of which is communicated with the opening and other end of which is opened on the other surface side of the semiconductor element, in the semiconductor element by an etching;

a fourth step of forming the through electrode in the through hole;

a fifth step of pasting a protection film on a surface of the second resist layer; and a sixth step of forming an insulating layer from other surface side of the semiconductor element to spread the insulating layer on an inner peripheral of the through hole, which extends to the one surface side of the semiconductor element, and a lower surface of the protection film.

5. A method of manufacturing a semiconductor device, according to claim 4, further comprising:

a seventh step of exposing one side of the through hole by releasing the protection film.

* * * * *